(12) United States Patent
Chen et al.

(10) Patent No.: US 10,952,354 B1
(45) Date of Patent: Mar. 16, 2021

(54) COLD PLATE WITH METAL TUBE CONNECTION AND FLEXIBLE METAL TUBE

(71) Applicant: Quanta Computer Inc., Taoyuan (TW)

(72) Inventors: Chao-Jung Chen, Taoyuan (TW); Yu-Nien Huang, Taoyuan (TW); Tsung-Ta Li, Taoyuan (TW); Kuo-Wei Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/752,100

(22) Filed: Jan. 24, 2020

Related U.S. Application Data (60) Provisional application No. 62/903,254, filed on Sep. 20, 2019.

(51) Int. Cl.
  *H05K 7/20* (2006.01)
  *H01L 23/473* (2006.01)
  *F16L 19/02* (2006.01)
  *H01L 23/46* (2006.01)
  *G06F 1/20* (2006.01)
  *F16L 19/04* (2006.01)

(52) U.S. Cl.
  CPC ...... *H05K 7/20772* (2013.01); *F16L 19/0225* (2013.01); *F16L 19/04* (2013.01); *G06F 1/20* (2013.01); *H01L 23/46* (2013.01); *H01L 23/473* (2013.01); *H05K 7/20254* (2013.01); *H05K 7/20272* (2013.01)

(58) Field of Classification Search
  CPC ...... F16L 15/006; F16L 19/0225; F16L 19/04
  See application file for complete search history.

(56) References Cited

U.S. PATENT DOCUMENTS

| | | | | |
|---|---|---|---|---|
| 1,058,542 A | * | 4/1913 | Brown | F16L 19/04 |
| | | | | 285/332.4 |
| 1,619,755 A | * | 3/1927 | Parker | F16L 19/04 |
| | | | | 285/334.5 |

(Continued)

FOREIGN PATENT DOCUMENTS

| | | |
|---|---|---|
| TW | M291484 U | 6/2006 |
| TW | M578928 U | 6/2019 |
| TW | M579714 U | 6/2019 |

OTHER PUBLICATIONS

TW Office Action for Application No. 109112577, dated Oct. 20, 2020, w/ First Office Action Summary.

(Continued)

*Primary Examiner* — Robert J Hoffberg
(74) *Attorney, Agent, or Firm* — Nixon Peabody LLP (57) ABSTRACT

A cold plate assembly for cooling heat-generating electrical component on a circuit board is disclosed. The cold plate assembly includes a cold plate with a bottom contact surface to thermally contact the heat-generating electrical component. The cold plate has an inlet coupler on an opposite top surface to receive coolant; an internal conduit to circulate the received coolant; and an outlet coupler on the opposite top surface to return the coolant. A flexible metal inlet tube is fluidly connected to the inlet coupler to supply coolant. A flexible metal outlet tube is fluidly connected to the outlet coupler to return coolant.

15 Claims, 6 Drawing Sheets

(56) References Cited

U.S. PATENT DOCUMENTS

| | | | | |
|---|---|---|---|---|
| 1,733,925 A | * | 10/1929 | Weatherhead, Jr. | F16L 19/005 285/334.5 |
| 1,839,909 A | * | 1/1932 | Weatherhead, Jr. | F16L 19/04 29/890.14 |
| 1,872,536 A | * | 8/1932 | Weatherhead, Jr. | F16L 19/04 285/148.6 |
| 1,893,441 A | * | 1/1933 | Parker | F16L 19/05 285/334.5 |
| 1,905,665 A | * | 4/1933 | Weatherhead, Jr. | F16L 19/04 29/890.15 |
| 1,943,717 A | * | 1/1934 | Barnes | F16L 19/04 285/332.1 |
| 1,982,533 A | * | 11/1934 | Parker | F16L 19/04 285/248 |
| 2,026,166 A | * | 12/1935 | Guarnaschelli | F16L 33/26 285/334.5 |
| 2,123,999 A | * | 7/1938 | Lauer | F16L 19/04 285/332.1 |
| 2,152,102 A | * | 3/1939 | Stecher | F16L 19/04 285/148.9 |
| 2,158,619 A | * | 5/1939 | Eastman | F16L 33/26 285/334.5 |
| 2,158,620 A | * | 5/1939 | Eastman | F16L 25/0036 285/334.5 |
| 2,332,353 A | * | 10/1943 | Stecher | F16L 19/04 29/890.14 |
| 2,463,196 A | * | 3/1949 | Parker | F16L 19/046 285/332.2 |
| 2,466,521 A | * | 4/1949 | Weatherhead, Jr. | F16L 19/04 285/334.5 |
| 2,534,199 A | * | 12/1950 | Guarnaschelli | F16L 19/045 285/334.5 |
| 5,720,504 A | * | 2/1998 | Stedman | F16L 19/0225 138/121 |
| 6,729,659 B2 | * | 5/2004 | Schroeder | F16L 19/0283 285/334.4 |
| 7,515,418 B2 | * | 4/2009 | Straznicky | H01L 23/4338 361/699 |
| 9,420,724 B2 | * | 8/2016 | Pietrantonio | H05K 7/209 |
| 10,405,458 B2 | * | 9/2019 | Fukunaga | H01R 13/2478 |
| 2007/0194567 A1 | * | 8/2007 | Pliassounov | B60T 17/043 285/334.5 |
| 2018/0116075 A1 | * | 4/2018 | Fukunaga | H05K 7/1487 |

OTHER PUBLICATIONS

TW Search Report for Application No. 109112577, dated Oct. 20, 2020, w/ First Office Action.

* cited by examiner

COLD PLATE WITH METAL TUBE CONNECTION AND FLEXIBLE METAL TUBE

PRIORITY CLAIM

The present disclosure claims priority to U.S. Provisional Application Ser. No. 62/903,254, filed Sep. 20, 2019. The contents of that application in its entirety are hereby incorporated by reference.

TECHNICAL FIELD

The present disclosure relates generally to a cooling system for a computer system. More particularly, aspects of this disclosure relate to a cooling system with flexible metal tubes that allow reliable coolant flow to cold plates.

BACKGROUND

Computer devices, such as servers, include numerous electronic components that are powered by a common power supply. Servers generate an enormous amount of heat due to the operation of internal heat-generating electrical devices such as controllers, processors, and memory. Overheating from the inefficient removal of such heat has the potential to shut down or impede the operation of such devices. Thus, current servers are designed to rely on air flow through the interior of the server to carry away heat generated from heat-generating electrical components. Servers often include various heat sinks that are attached to the electronic components such as processing units. Heat sinks absorb the heat from the electronic components, thus transferring the heat away from the components. The heat from heat sinks must be vented away from the server by a fan system.

Due to the improvement of high-performance systems, the amount of heat that needs to be removed becomes higher with each new generation of electronic components. With the advent of more powerful components, traditional air cooling in combination with fan systems is inadequate to sufficiently remove heat generated by newer generation components. The development of liquid cooling has been spurred by the need for increased cooling. Liquid cooling is the currently accepted solution for rapid heat removal due to the superior thermal performance from liquid cooling. At room temperature, the heat transfer coefficient of air is only 0.024 W/mK while a coolant, such as water, has a heat transfer coefficient of 0.58 W/mK, which is 24 times than that of air. Thus, liquid cooling is more effective in transporting heat away from a heat source to a radiator, and allows heat removal from critical parts without noise pollution.

In rack level liquid cooling system designs, the cooling liquid source includes a closed loop cooling system and an open loop cooling system to facilitate heat exchange from devices such as servers in the rack. Closed loop liquid cooling systems use heat exchange to cool hot water which is heated from the servers. Heat is then removed from the hot water via an open loop system such as a fan wall. An inlet tube carries coolant liquid to a cold plate over a heat-generating electrical component, such as a processor chip, in the server. The cold plate has a network of internal conduits that circulate the coolant internally in the cold plate. Each processor in a server may have a dedicated cold plate or share a cold plate with another processor. Heat generated by the processor is transferred to the cold plate and is in turn transferred to the coolant liquid circulating through the cold plate. An outlet tube carries heated liquid away from the cold plate. A heat exchanger transfers heat from the heated liquid by being cooled by a fan wall. The now cooled coolant is then recirculated to the inlet tube back to the cold plate.

Figure 1A:
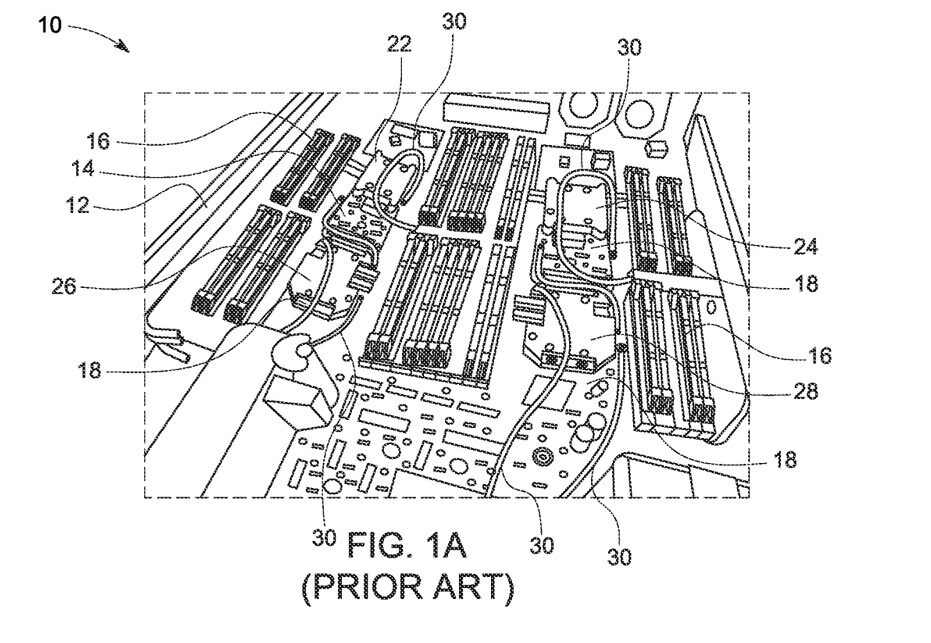
FIG. 1A is a perspective view of a prior art server having cold plates installed on heat-generating electrical components.

FIG. 1A is a perspective view of a prior art server 10 having cold plates installed on components. The server 10 includes a chassis 12 that has a circuit board 14 mounting components such as memory cards 16 and processors 18. In this example, four cold plates 22, 24, 26, and 28 are mounted over heat-generating electrical components such as the processors 18 to transfer heat away from the processors 18. A series of tubes 30 are provided to circulate coolant to the cold plates 22, 24, 26, and 28 and collect heated coolant. Generally, the chassis 12 includes fluid connectors that may be fluidly connected to a rack mounted heat exchanger.

Figure 1B:
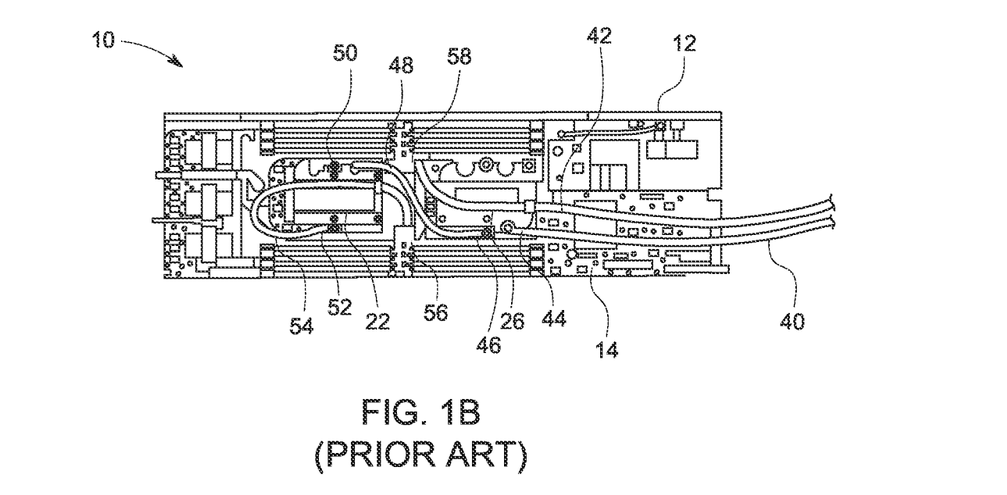
FIG. 1B is a top view of the prior art cold plates in FIG. 1A with plastic tubes circulating coolant to the cold plates.

FIG. 1B is a top view of the prior art cold plates 22 and 26 in FIG. 1A with two plastic tubes 40 and 42 providing coolant. The tube 40 is an inlet tube that provides coolant to the cooling plates 22 and 26. The tube 40 is a plastic hose that is coupled to the cold plate 26 via a coupler 44. The coupler 44 is a metal component of the cold plate 26 and therefore requires an O-ring to create a seal with the plastic tube 40. Another coupler 46 is connected to one end of another plastic hose 48 that has an opposite end connected to a coupler 50 of the cold plate 22. Coolant is thus provided by the plastic hose 48 to the cold plate 22.

The coolant is circulated internally in both cold plates 22 and 26 to carry away heat generated from the processors 18 under the cold plates 22 and 26. The heated coolant is removed from the cold plate 22 through a coupler 52 that is attached to the end of a plastic hose 54. The other end of the plastic hose 54 is attached to a coupler 56 on the cold plate 26. The coolant received by the coupler 56 is directed internally by a manifold to the cold plate 22, which has another coupler 58 that is attached to the tube 42. The tube 42 carries away the heated coolant from the cold plates 22 and 26 to the heat exchanger.

The benefit of the plastic hoses 40 and 42 is that such hoses may be easily bent to accommodate the internal structure of the server chassis 12. Because the internal space of the chassis 12 is generally very crowded with other components, the cold plates may be still installed by bending the hoses around intervening components, without having to relocate other components in the chassis layout. However, plastic hoses require an O-ring on couplers to prevent coolant from leaking in the couplers. The O-rings eventually degrade resulting in coolant leaks after a few years of use.

The alternative is the use of metal tubes to provide coolant to the cold plate. However rigid metal tubes do not allow for simple routing around intervening components, requiring specially designed metal tubes for the particular circuit board configuration. Further, in order to replace one of the underlying processors, all of the attached cold plates must be removed at the same time, and the metal tubes must be removed since the tubes are rigid.

Thus, there is a need to eliminate the need for degradable sealing mechanisms, such as O-rings, that are used to attach tubes to fluid connectors to supply coolant to a cold plate. There is another need to allow flexible tubes to route coolant to a cold plate without leaking coolants in supplying the cold plate. There is another need to provide tubes fluidly connecting the cold plate that allow ease in replacing or servicing devices under the cold plate.

SUMMARY

One disclosed example is a cooling system including an inlet manifold for delivering coolant at a first temperature, and an outlet manifold for receiving coolant at a second temperature that is higher than the first temperature. A first fluidic circuit is located between the inlet manifold and the outlet manifold. The first fluidic circuit has a first cold plate couplable to a first heat-generating electrical component. The first fluidic circuit has a flexible metal inlet tube couplable to the first cold plate and the inlet manifold. The first fluidic circuit has a flexible metal outlet tube couplable to the first cold plate and the outlet manifold.

In another disclosed implementation of the example cooling system, the system includes a second fluidic circuit between the inlet manifold and the outlet manifold. The second fluidic circuit has a second cold plate couplable to a second heat-generating electrical component. The system also includes another flexible metal inlet tube couplable to the second cold plate and the inlet manifold. The system also includes another flexible metal outlet tube couplable to the second cold plate and the outlet manifold, such that the second cold plate can move independent of the first cold plate. In another disclosed implementation, the first fluidic circuit comprises an additional cold plate. In another disclosed implementation, the first fluidic circuit includes a rigid metal tube having one end connected to the first cold plate and an opposite end connected to the flexible metal inlet tube. In another disclosed implementation, the rigid metal tube is connected to the flexible metal inlet tube by welding. In another disclosed implementation, the heat-generating electrical component is a processor chip mounted on a circuit board. In another disclosed implementation, the processor chip is one of a graphic processing unit (GPU) chip or a central processing unit (CPU) chip. In another disclosed implementation, the first cold plate may be lifted over the heat-generating electrical component without disconnecting the flexible metal inlet tube or the flexible metal outlet tube. In another disclosed implementation, the cold plate includes a connector assembly for receiving fluid from rigid metal tube. The connector assembly includes a coupler having an interior chamber that has a threaded interior surface; a screw member having an exterior threaded surface mateable with the threaded interior surface of the threaded interior surface; and a through bore to hold the rigid metal tube. The rigid metal tube includes an open end with an annular shoulder that is engaged between the coupler and the screw member when the threaded surfaces engage each other.

Another disclosed example is a cold plate assembly for cooling a heat-generating electrical component on a circuit board. The cold plate assembly includes a cold plate with a bottom contact surface to thermally contact the heat-generating electrical component. The cold plate has an inlet coupler on an opposite top surface to receive coolant; an internal conduit to circulate the received coolant; and an outlet coupler on the opposite top surface to return the coolant. A flexible metal inlet tube is fluidly connected to the inlet coupler to supply coolant. A flexible metal outlet tube is fluidly connected to the outlet coupler to return coolant.

In another disclosed implementation of the example cold plate assembly, the cold plate assembly includes an attachment mechanism to attach the cold plate to the circuit board. In another disclosed implementation, the assembly includes a first rigid metal tube having one end connected to the inlet coupler, and an opposite end connected to the flexible metal inlet tube. The assembly further includes a second rigid metal tube having one end connected to the outlet coupler, and an opposite end connected to the flexible metal outlet tube. In another disclosed implementation, the first rigid metal tube is connected to the flexible metal inlet tube by welding, and the second rigid metal tube is connected to the flexible metal outlet tube by welding. In another disclosed implementation, the inlet coupler and the outlet coupler each comprise an interior chamber having a threaded interior surface; a screw member having an exterior threaded surface mateable with the threaded interior surface of the threaded interior surface; and a through bore to hold the rigid metal tube. The first and second rigid metal tube include an open end with an annular shoulder that is engaged between the coupler and the screw member, when the threaded surfaces engage each other.

Another disclosed example is a computer server including a circuit board and a first heat-generating electrical component mounted on the circuit board. A first cold plate is mounted on the first heat-generating electrical component. The first cold plate includes an outlet coupler and an inlet coupler. An inlet manifold is operable to supply coolant. A flexible metal inlet tube is coupled between the inlet manifold and the inlet coupler. An outlet manifold is operable to collect coolant. A flexible metal outlet tube is coupled between the outlet manifold and the outlet coupler.

In another disclosed implementation of the example computer server, the heat-generating electrical component is one of a graphic processing unit (GPU) chip or a central processing unit (CPU) chip. In another disclosed implementation, the computer server includes a second cold plate mounted on a second heat-generating electrical component. The second cold plate includes an outlet coupler and an inlet coupler. The computer server also includes another inlet flexible metal tube coupled between the inlet manifold and the inlet coupler of the second cold plate. The computer server also includes another outlet flexible metal tube coupled between the outlet manifold and the outlet coupler of the second cold plate. The second cold plate can move independent of the first cold plate. In another disclosed implementation, the computer server includes a second cold plate mounted on a second heat-generating electrical component. The second cold plate has an outlet coupler and an inlet coupler. The second cold plate receives coolant via a fluidic circuit including the first cold plate.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to a flexible metal tube that may be fluidly coupled to a cold plate for a heat-generating electrical component in a server chassis. The cold plate has a connector assembly that eliminates the need for an O-ring. The connector assembly uses a screw member to provide the interface between a rigid metal tube and a coupler of the cold plate. The connector assembly provides a robust connection to the rigid metal tube and eliminates the risk of coolant leaks. The rigid metal tube is connected to the flexible metal tube that supplies coolant from a manifold. The flexible metal tube allows coolant to be routed around intervening components to the cold plate, thus allowing design flexibility in the chassis layout for the placement of heat-generating electrical components.

Figure 2A:
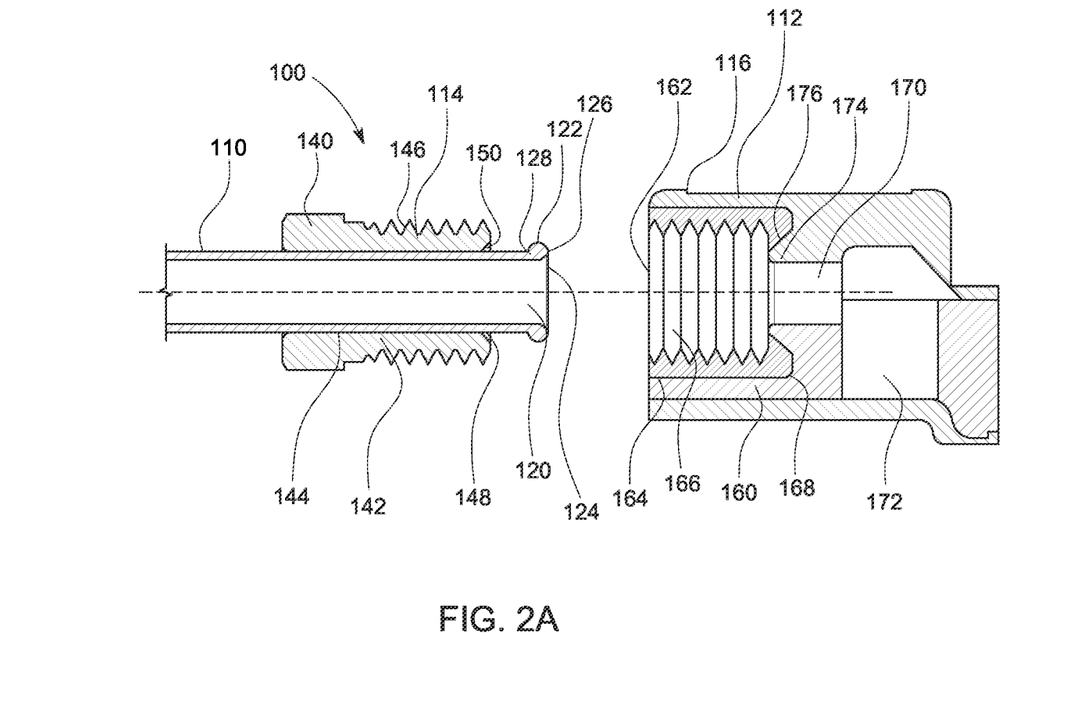
FIG. 2A is a cross-section view of the components of an example connector assembly for a metal tube, according to certain aspects of the present disclosure.
Figure 2B:
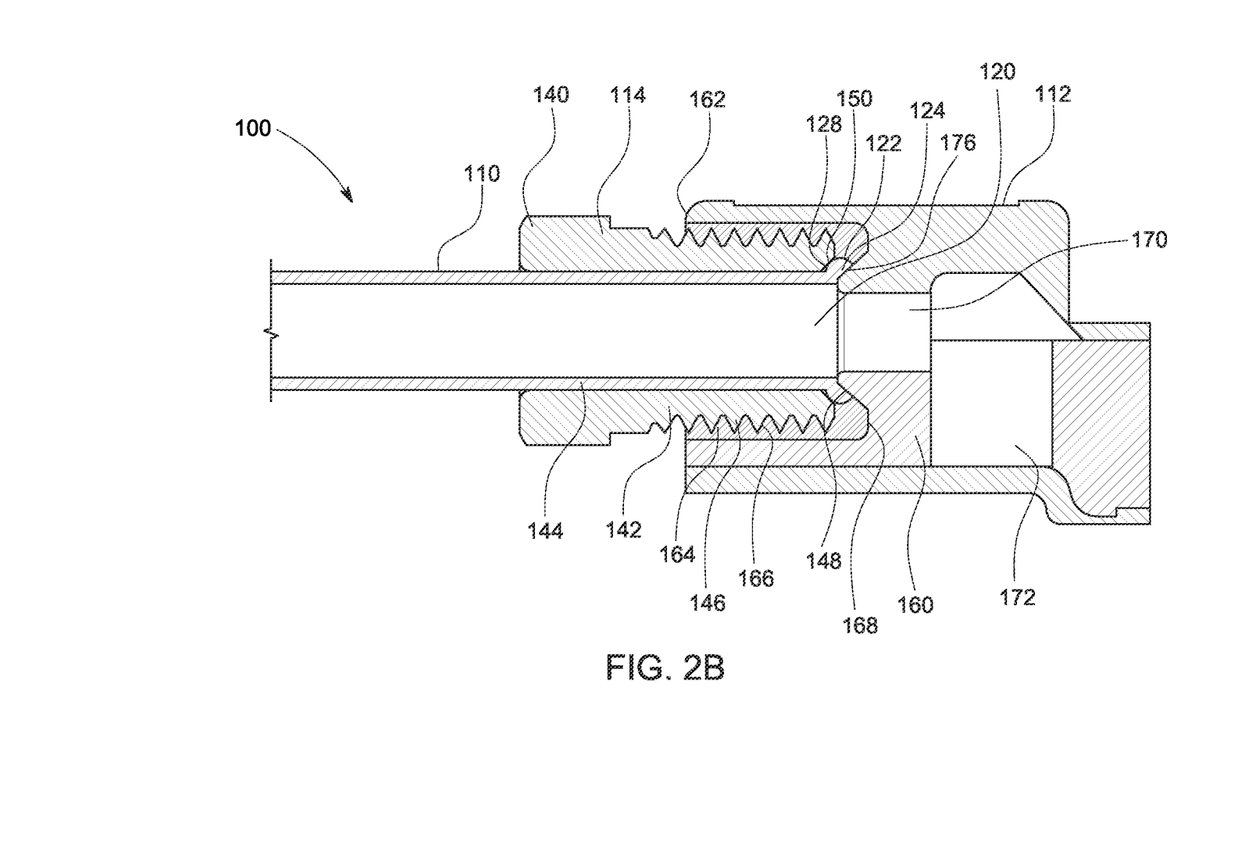
FIG. 2B is a cross-section of the assembled components of the example connector assembly in FIG. 2A, according to certain aspects of the present disclosure.

FIG. 2A is a cross-section view of the components of an example connector assembly 100 for a metal tube 110 and a cold plate 112. FIG. 2B is a cross-section of the assembled components of the example connector assembly 100. The metal tube 110 is inserted in a screw member 114 that joins the tube 110 to a coupler 116 of the cold plate 112. The metal tube 110 is generally tubular and has an open end 120 with an annular shoulder 122 that extends out from the exterior surface of the tube 110. The annular shoulder 122 has a sloped interior surface 124 that transitions to a flat circular shoulder end surface 126.

The screw member 114 has a cylindrical head 140 attached to a cylindrical stem 142. The head 140 has a larger diameter than the stem 142. A through bore 144 extends through the center of the head 140 and the stem 142. The through bore 144 is of sufficient diameter to allow the tube 110 to be inserted. The stem 142 has a threaded exterior surface 146. The stem 142 has an open end 148 defining one end of the through bore 144 that includes a slanted exterior surface 150.

The coupler 116 of the cold plate 112 includes a generally cylindrical body 160 that has an open end 162 defining an interior cylindrical chamber 164. The interior cylindrical chamber 164 includes a threaded interior surface 166. The interior cylindrical chamber 164 is bounded by a back wall 168. An interior bore 170 formed in the back wall 168 allows fluid communication with an interior conduit 172 in the cold plate 112. The interior conduit 172 leads to other internal conduits that allow the coolant to circulate throughout the cold plate 112.

The back wall 168 includes a circular mesa 174 that extends out from the back wall 168 to define the interior bore 170. The mesa 174 includes a circular sloped surface 176 that extends from the back wall 168 to the top of the mesa 174.

The screw member 114 is slipped over the tube 110 on the opposite end from the open end 120. The tube 110 is thus seated in the through bore 144 of the screw member 114. The annular shoulder 122 rests on the sloped exterior surface 150 at the open end 148 of the screw member 114. The screw member 114 is then inserted into the interior chamber 164 of the coupler 116. The threaded exterior surface 146 of the screw member 114 engages the threaded interior surface 166 of the interior chamber 164 of the coupler 116. The screw member 114 and the attached tube 110 are thus rotated to advance to the position shown in FIG. 2B. The sloped surface 124 of the annular shoulder 122 contacts the sloped surface 176 of the mesa 174. An opposite side 128 of the annular shoulder 122 is in contact with the exterior sloped surface 150 of the screw member 114. In this manner the annular shoulder 122 is crimped between the screw member 114 and the coupler 116 to create a fluid seal between the tube 110 and the coupler 116. As shown in FIG. 2B, coolant through the tube 110 may be directed to the interior bore 170 of the coupler 116 to the interior of the cold plate 112.

In this example, the tube 110 is constructed of relatively softer rigid metal such as copper or stainless steel, while the screw member 114 and the coupler 116 are preferably constructed of a harder metal such as stainless steel. As explained here, the opposite end of the open end 120 of the tube 110 is connected to a flexible metal hose or tube via welding or a coupler. The flexible metal hose or tube supplies coolant to the tube 110. The coupling assembly 100 eliminates the need for O-rings or other sealing mechanisms that lose their durability.

Figure 3:
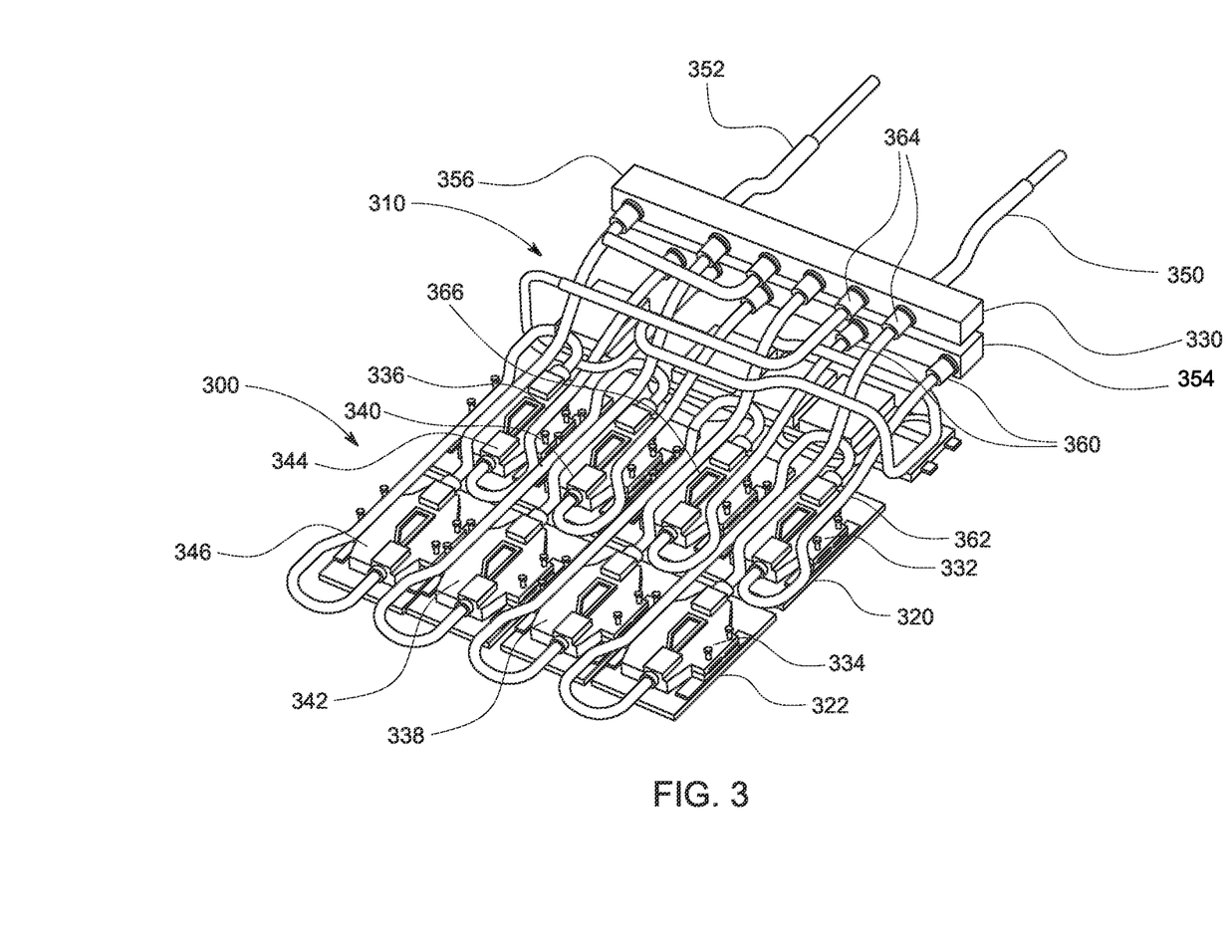
FIG. 3 is a perspective view of a cooling manifold with flexible metal tubes providing coolant to cold plates for components in a server, according to certain aspects of the present disclosure.

FIG. 3 is a perspective view of a server 300 with a closed loop cooling system 310. The server 300 includes a circuit board 320 that mounts heat-generating electrical components such as processor chips 322. In this example, the processor chips 322 may be different types of processors such as central processing units (CPU)s or graphic processing units (GPU)s. It is to be understood that there are other structures such as sockets, memory cards, and other components on the circuit board 320. Any number of processor chips or other types of chips may be mounted on the circuit board 320.

The cooling system 310 includes a manifold 330 and a series of eight cold plates 332, 334, 336, 338, 340, 342, 344, and 346. Each of the cold plates 332, 334, 336, 338, 340, 342, 344, and 346 has a bottom surface in contact with a respective processor chip 322. The cold plates 332, 334, 336, 338, 340, 342, 344, and 346 are construed of thermally conductive material such as metal. Each of the cold plates 332, 334, 336, 338, 340, 342, 344, and 346 include internal conduits that circulate coolant to transfer heat from the respective processor chip 322.

The manifold 330 is connected to a main coolant supply pipe 350 and a main coolant return pipe 352. The coolant supply pipe 350 supplies coolant to a coolant supply manifold block 354. Returned coolant is collected by a coolant return manifold block 356 that is connected to the main coolant return pipe 352. The manifold block 354 has a series of four connectors 360 that supply coolant to connected flexible tubes 362 connected to the cold plates 332, 334, 336, 338, 340, 342, 344, and 346. The other two connectors 360 are connected to tubes connected to other cold plates in the server 300. The flexible tubes 362 in this example are flexible vacuum flexible tubes manufactured by DTI. Similarly, the manifold block 356 has a series of four connectors 364 that are connected to flexible tubes 366 that return coolant from the cool plates 332, 334, 336, 338, 340, 342, 344, and 346. The other two connectors 364 shown in FIG. 3 are connected to other cold plates in the server 300.

The manifold 330 thus includes the inlet manifold block 354 that delivers coolant at a first temperature, and the outlet manifold block 356 for receiving coolant at a second temperature that is higher than the first temperature. Each of the sets of cold plates 332, 334, 336, 338, 340, 342, 344, and 346 thus may be fluidly connected to the manifold blocks 354 and 356 via the flexible metal tubes 362 and 366 to create fluid circuits between the manifold blocks 354 and 356. Thus, a fluidic circuit is defined between the inlet manifold block 354 and the outlet manifold block 356. The fluidic circuit includes the cold plates 332 and 334 that each are coupled to heat-generating electrical components such as the processors 322. The fluidic circuit may also include only a single cold plate or more than two cold plates that are fluidly coupled to each other. Other fluid circuits are defined by the flexible metal tubes 362 and 366, the manifold blocks 354 and 356, and the other cold plates, such as cold plates 336 and 338. Thus, a second fluidic circuit may be formed with the cold plates 336 and 338, and separate flexible tubes 362 and 366.

Figure 4:
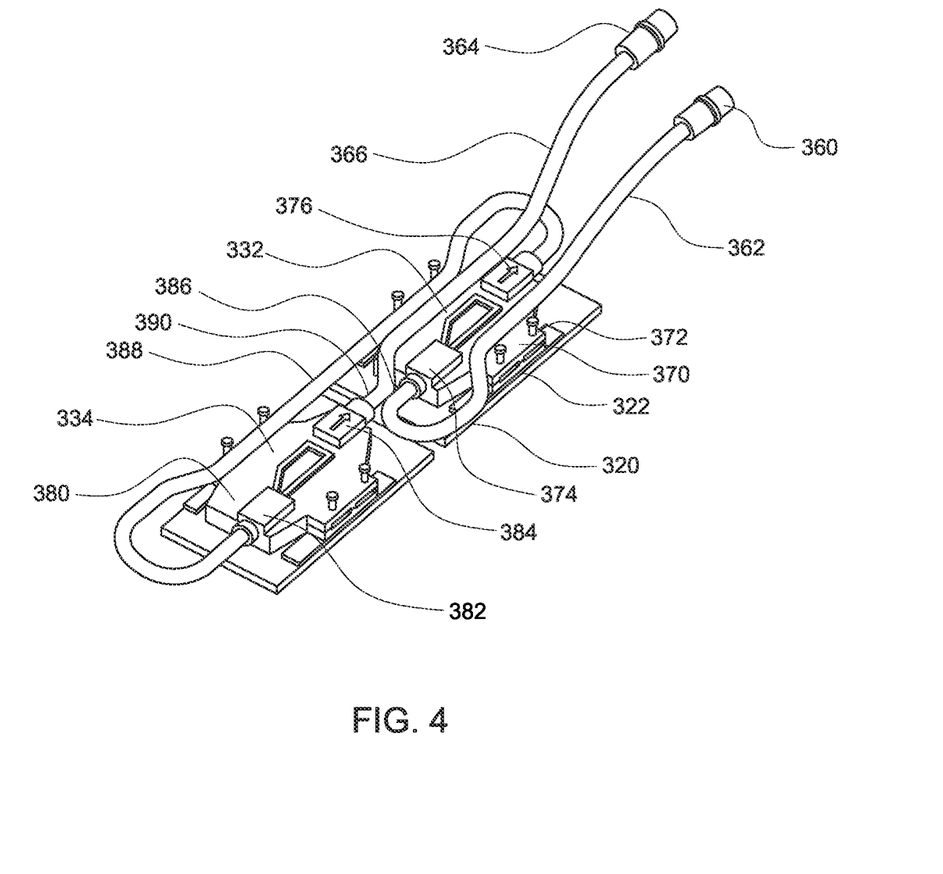
FIG. 4 is a close-up perspective view of the flexible metal tubes providing fluid to one of the cold plates in the server in FIG. 3, according to certain aspects of the present disclosure.

FIG. 4 is a close-up perspective view of the flexible metal tubes 362 and 366 providing fluid to the cold plates 332 and 334 in the server 300 in FIG. 3. As explained herein, the cold plates 332 and 334 are part of a fluid circuit. The cold plate 332 has a relatively flat top surface 370 and an opposite bottom surface that is in thermal contact with a heat-generating electrical component such as the processor 322. The cold plate 332 is joined to the circuit board 320 via screws 372 that are inserted into the top surface 370. In this example, the top surface 370 includes couplers 374 and 376. The couplers 374 and 376 are similar to the coupler 116 shown in FIGS. 2A-2B. Similarly, the cold plate 334 includes a top surface 380 that includes couplers 382 and 384. One end of a rigid metal tube 386 similar to the tube 110 in FIGS. 2A-2B is welded to one end of the flexible metal tube 362. The other end of the rigid metal tube 386 is connected to the coupler 374, similar to the assembly 100 shown in FIGS. 2A-2B. As may be seen in FIG. 2B, the rigid metal tube 386 is shaped to follow the top surface 370 of the cold plate 332. The end of the rigid metal tube 386 connects to the flexible metal tube 362 at one edge of the cold plate 332.

The coolant is supplied through the flexible tube 362 and the rigid tube 386 to the cold plate 332 through the coupler 374. After circulating through the cold plate 332, the coolant exits through the coupler 376. One end of a pipe 388 is connected to the coupler 376 to provide coolant to the coupler 382 of the cold plate 334. In this example, the pipe 388 is a rigid metal pipe that is shaped to curve around the cold plates 332 and 334. After circulating through the cold plate 334, the coolant exits through the coupler 384 to one end of a rigid metal tube 390. The other end of the rigid metal tube 390 is welded to the flexible tube 366 to return the heated coolant to the manifold 330 in FIG. 3A. The rigid metal tube 390 is shaped to follow the contour of the side of the cold plate 332, and is connected to the flexible tube 366 near the edge of the cold plate 332.

The flexible tubes 362 and 366 allow coolant to be supplied to the cold plates 332 and 334 around different configurations of intervening structures between the manifold 330 and the processors 322. The flexibility of the flexible tubes 362 and 366 allows them to be bent around such intervening structures and thus supply coolant to the cold plates 332 and 334. The flexibility of the tubes 362 and 366 also allows easier access to the components under the cold plates 332 and 334.

Figure 5:
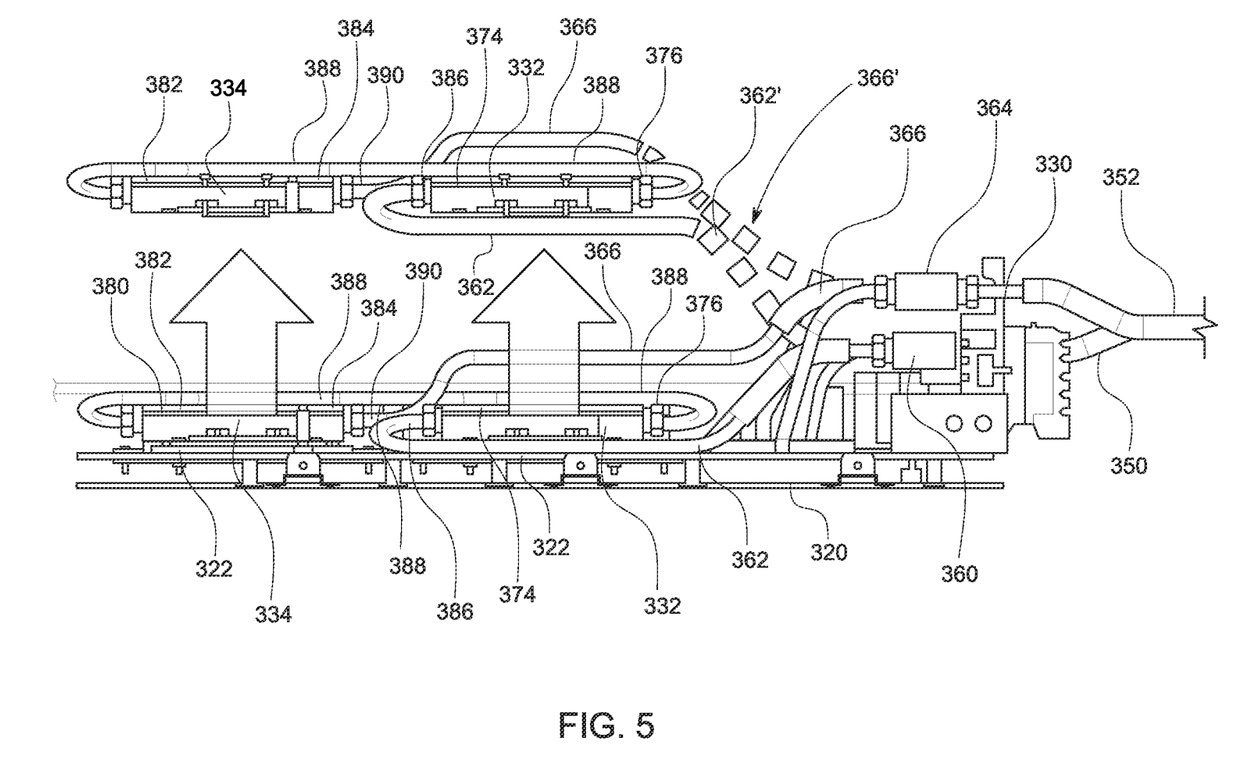
FIG. 5 is a side view of the server in FIG. 4 showing the lifting of the cold plates to allow access to components in the server, according to certain aspects of the present disclosure.

FIG. 5 is a side view of the cold plates 332 and 334 in FIG. 4 showing the movement of the cold plates 332 and 334 to allow access to components, such as the processors 322, in the server 300. Like elements in FIG. 5 are labeled with like element numbers to their counterparts in FIGS. 3-4. As shown in FIG. 5, the cold plates 332 and 334, rigid tubes 386 and 390, and attached tube 388 may be lifted to a position via a motion shown by the arrows, once the screws 372 attaching the cold plates 332 and 334 to the circuit board 320 are removed. The flexible tubes 362 and 366 of the fluidic circuit including the cold plates 332 and 334 allow the cold plates 332 and 334 to be moved independently of the other cold plates 336, 338, 340, 342, 344, and 346 in other fluid circuits (in FIG. 3). This facilitates maintenance as only certain cold plates of a single fluidic circuit need be moved to access a particular component as opposed to moving all of the cold plates.

The cold plates 332 and 334 may stay attached to the tubes 362 and 366 when the cold plates 332 and 334 are moved because the tubes 362 and 366 are flexible. The blocked outline of tubes 362' and 366' show the shape of tubes 362' and 366' that is created when the cold plates 332 and 334 are lifted away from the circuit board 320. As explained herein, the remaining cold plates in the server 300 in FIG. 3 may remain in place. Once the cold plates 332 and 334 are lifted above the circuit board 320, the processors 332 under the cold plates 332 and 334 may be replaced. The cold plates 332 and 334 may then be lowered back onto the new processors and reattached to the circuit board 320. When the cold plates 332 and 334 are lowered, the tubes 362 and 366 return to their former position and shape. Thus, the flexible tubes 362 and 366 do not have to be disconnected from the cold plates 332 and 334, thereby saving time in replacing the processors 322. This allows an operator to service one or two processors individually by only removing the associated cold plates.

The principles disclosed herein may be adopted for cooling different types of processing chips. For example, in the case of graphic processing units (GPUs), cold plates that are very close together with the same fluid circuit may be required such as the arrangement shown in FIGS. 4-5. The flexible metal tubes allow ready access to such processors in such an arrangement. Alternatively, single cold plates having a single fluid circuit may be used for less energy intense components such as central processing units (CPUs). The flexible metal tubes 362 and 366 do not flatten because the thickness of the metal walls is thick enough to prevent flattening when the tubes are bent.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A cooling system comprising:
    an inlet manifold for delivering coolant at a first temperature;
    an outlet manifold for receiving the coolant at a second temperature that is higher than the first temperature;
    a first fluidic circuit between the inlet manifold and the outlet manifold, the first fluidic circuit comprising:
    a first flexible metal tube couplable to one of the inlet manifold and the outlet manifold;
    a rigid metal tube more rigid than the first flexible metal tube, the rigid metal tube having:
        one end connected to the first flexible metal tube; and
        an open end opposite to the one end, the open end including an annular shoulder, the annular shoulder having a sloped interior surface that transitions to a flat circular shoulder end surface and a side opposite to the sloped interior surface;
    a first cold plate couplable to a first heat-generating electrical component, the first cold plate connected to the open end of the rigid metal tube; the first cold plate including a connector assembly for receiving or providing the coolant from the rigid metal tube, the connector assembly comprising:
        a coupler having an interior chamber, the interior chamber having:
            a threaded interior surface; and
            a circular sloped surface;
        a screw member having:
            an exterior threaded surface mateable with the threaded interior surface of the interior chamber of the coupler; and
            a through bore allowing the rigid metal tube to pass through the screw member, the through bore including a sloped exterior surface;
        wherein when the sloped exterior surface of the screw member presses the side of the annular shoulder of the rigid metal tube as the exterior threaded surface of the screw member and the threaded interior surface of the coupler engage each other, the sloped interior surface of the rigid metal tube is configured to crimp between the sloped exterior surface of the screw member and the circular sloped surface of the coupler to create a fluid seal between the rigid metal tube and the coupler; and
    a second flexible metal tube couplable to the first cold plate and another of the inlet manifold and the outlet manifold.

2. The cooling system of claim 1, further comprising a second fluidic circuit between the inlet manifold and the outlet manifold; the second fluidic circuit comprising a second cold plate couplable to a second heat-generating electrical component; a third flexible metal tube couplable to the second cold plate and the inlet manifold; and a fourth flexible metal tube couplable to the second cold plate and the outlet manifold such that the second cold plate can move independently of the first cold plate.

3. The cooling system of claim 1, wherein the first fluidic circuit comprises an additional cold plate.

4. The cooling system of claim 1, wherein the rigid metal tube is connected to the first flexible metal tube by welding.

5. The cooling system of claim 1, wherein the first heat-generating electrical component is a processor chip mounted on a circuit board.

6. The cooling system of claim 5, wherein the processor chip is one of a graphic processing unit (GPU) chip or a central processing unit (CPU) chip.

7. The cooling system of claim 5, wherein the first cold plate is configured to be lifted over the first heat-generating electrical component without disconnecting the first flexible metal tube or the second flexible metal tube.

8. A cold plate assembly for cooling a heat-generating electrical component on a circuit board, the cold plate assembly comprising:
    a cold plate including:
        a bottom contact surface to thermally contact the heat-generating electrical component;
        an inlet connector assembly comprising:
            an inlet coupler on an opposite top surface to receive coolant, the inlet coupler having an inlet interior chamber, the inlet interior chamber having:
                an inlet threaded interior surface; and
                an inlet circular sloped surface; and
            an inlet screw member having:
                an inlet exterior threaded surface mateable with the inlet threaded interior surface of the inlet interior chamber of the coupler; and
                an inlet through bore including an inlet sloped exterior surface;
        an internal conduit to circulate the received coolant;
        an outlet coupler on the opposite top surface to return the coolant;

a flexible metal inlet tube fluidly connected to the inlet coupler to supply the coolant;

a rigid metal inlet tube more rigid than the flexible metal inlet tube, the rigid metal inlet tube operable to pass through the inlet through bore of the inlet screw member, the rigid metal inlet tube having:

an inlet one end connected to the flexible metal inlet tube; and an inlet open end opposite to the inlet one end, the inlet open end including an inlet annular shoulder, the inlet annular shoulder having an inlet sloped interior surface that transitions to an inlet flat circular shoulder end surface and an inlet side opposite to the inlet sloped interior surface;

wherein when the inlet sloped exterior surface of the inlet screw member presses the inlet side of the inlet annular shoulder of the rigid metal inlet tube as the inlet exterior threaded surface of the inlet screw member and the inlet threaded interior surface of the inlet coupler engage each other, the inlet sloped interior surface of the rigid metal inlet tube is configured to crimp between the inlet sloped exterior surface of the inlet screw member and the inlet circular sloped surface of the inlet coupler to create a fluid seal between the rigid metal inlet tube and the inlet coupler; and a flexible metal outlet tube fluidly connected to the outlet coupler to return the coolant.

9. The cold plate assembly of claim 8, further comprising an attachment mechanism to attach the cold plate to the circuit board.

10. The cold plate assembly of claim 8, wherein the rigid metal inlet tube is connected to the flexible metal inlet tube by welding and wherein the rigid metal outlet tube is connected to the flexible metal outlet tube by welding.

11. The cold plate assembly of claim 8, wherein the outlet coupler comprise an outlet interior chamber having an outlet threaded interior surface and an outlet circular slope surface; the cold plate assembly further comprising:

an outlet screw member having an outlet exterior threaded surface mateable with the outlet threaded interior surface of the outlet interior chamber; and an outlet through bore to hold the rigid metal outlet tube, and wherein the rigid metal outlet tube includes an outlet one end connected to the flexible metal outlet tube and an outlet open end opposite to the outlet one end, the outlet open end including an outlet annular shoulder, the outlet annular shoulder having an outlet sloped interior surface that transitions to an outlet flat circular shoulder end surface and an outlet side opposite to the outlet sloped interior surface;

wherein when the outlet sloped exterior surface of the outlet screw member presses the outlet side of the outlet annular shoulder of the rigid metal outlet tube as the outlet exterior threaded surface of the outlet screw member and the outlet threaded interior surface of the outlet coupler engage each other, the outlet sloped interior surface of the rigid metal outlet tube is configured to crimp between the outlet sloped exterior surface of the outlet screw member and the outlet circular sloped surface of the outlet coupler to create a fluid seal between the rigid metal outlet tube and the outlet coupler.

12. A computer server comprising:

a circuit board;

a first heat-generating electrical component mounted on the circuit board;

a first cold plate mounted on the first heat-generating electrical component, the first cold plate including an outlet coupler and an inlet coupler;

an inlet manifold operable to supply coolant;

a flexible metal inlet tube coupled between the inlet manifold and the inlet coupler;

an outlet manifold operable to collect the coolant;

a flexible metal outlet tube coupled between the outlet manifold and the outlet coupler; and a rigid metal inlet tube more rigid than the flexible metal inlet tube, the rigid metal inlet tube having:

one end connected to the flexible metal inlet tube; and an open end opposite to the one end, the open end including an annular shoulder, the annular shoulder having a sloped interior surface that transitions to a flat circular shoulder end surface and a side opposite to the sloped interior surface, the open end coupled to the inlet coupler;

wherein the inlet coupler comprises:

an interior chamber, the interior chamber having:

a threaded interior surface; and a circular sloped surface;

an inlet screw member having:

an exterior threaded surface mateable with the threaded interior surface of the interior chamber of the inlet coupler; and a through bore allowing the rigid metal inlet tube to pass through the inlet screw member, the through bore including a sloped exterior surface; and wherein when the sloped exterior surface of the inlet screw member presses the side of the annular shoulder of the rigid inlet metal tube as the exterior threaded surface of the inlet screw member and the threaded interior surface of the inlet coupler engage each other, the sloped interior surface of the rigid metal tube is configured to crimp between the sloped exterior surface of the inlet screw member and the circular sloped surface of the inlet coupler to create a fluid seal between the rigid metal inlet tube and the inlet coupler.

13. The computer server of claim 12, wherein the heat-generating electrical component is one of a graphic processing unit (GPU) chip or a central processing unit (CPU) chip.

14. The computer server of claim 12, further comprising:

a second cold plate mounted on a second heat-generating electrical component, the second cold plate including a second outlet coupler and a second inlet coupler;

another inlet flexible metal tube coupled between the first inlet manifold and the second inlet coupler;

another outlet flexible metal tube coupled between the outlet manifold and the second outlet coupler, wherein the second cold plate can move independently of the first cold plate.

15. The computer server of claim 12, further comprising a second cold plate mounted on a second heat-generating electrical component, the second cold plate including a second outlet coupler and a second inlet coupler, wherein the second cold plate receives the coolant via a fluidic circuit including the first cold plate.

* * * * *